United States Patent
Ma et al.

(10) Patent No.: US 11,661,675 B2
(45) Date of Patent: May 30, 2023

(54) HIGH-PURITY SEMI-INSULATING SINGLE-CRYSTAL SILICON CARBIDE WAFER AND CRYSTAL

(71) Applicant: TAISIC MATERIALS CORP., Taoyuan (TW)

(72) Inventors: Dai-Liang Ma, Taoyuan (TW); Bang-Ying Yu, Taoyuan (TW); Bo-Cheng Lin, Taoyuan (TW)

(73) Assignee: TAISIC MATERIALS CORP., Taoyuan (TW)

( * ) Notice: Subject to any disclaimer, the term of this patent is extended or adjusted under 35 U.S.C. 154(b) by 160 days.

(21) Appl. No.: 17/338,642

(22) Filed: Jun. 3, 2021

(65) Prior Publication Data

US 2021/0395918 A1 Dec. 23, 2021

(30) Foreign Application Priority Data

Jun. 18, 2020 (TW) .................................. 109120678

(51) Int. Cl.
*C30B 29/36* (2006.01)
*C30B 23/02* (2006.01)
*H01L 29/36* (2006.01)
*H01L 29/16* (2006.01)

(52) U.S. Cl.
CPC .............. *C30B 29/36* (2013.01); *C30B 23/02* (2013.01); *H01L 29/1608* (2013.01); *H01L 29/36* (2013.01)

(58) Field of Classification Search
CPC .......... C30B 29/36; C30B 23/00; C30B 23/02
See application file for complete search history.

(56) References Cited

U.S. PATENT DOCUMENTS

| 5,611,955 | A | 3/1997 | Barrett et al. |
| 7,018,597 | B2 | 3/2006 | Ellison et al. |
| 9,200,381 | B2 | 12/2015 | Leonard et al. |
| 2003/0079676 | A1 * | 5/2003 | Ellison .................... C30B 29/36 257/E21.054 |
| 2006/0137600 | A1 * | 6/2006 | Ellison .................... C30B 25/00 257/E29.198 |
| 2013/0320275 | A1 | 12/2013 | Zwieback et al. |

FOREIGN PATENT DOCUMENTS

| CN | 101114593 A | * 1/2008 | ............. C30B 29/36 |
| CN | 101914811 A | 12/2010 | |
| EP | 3770114 A1 | * 1/2021 | ........... C01B 32/956 |

OTHER PUBLICATIONS

F. Fuchs, B. Stender, M. Trupke, D. Simin, J. Pflaum, V. Dyakonov & G. V. Astakhov, Engineering near-infrared single-photon emitters with optically active spins in ultrapure silicon carbide, Nature Communications vol. 6, Article No. 7578, Jul. 7, 2015.

D. Riedel, F. Fuchs, H. Kraus, S. Vaeth, A. Speriich, V. Dyakonov, A. A. Soltamova, P. G. Baranov, V. A. Ilyin, G. V. Astakhov, Resonant Addressing and Manipulation of Silicon Vacancy Qubits in Silicon Carbide, Physical Review Letters, PRL 109, 226402, Nov. 30, 2012.

* cited by examiner

*Primary Examiner* — Elizabeth E Mulvaney

(57) ABSTRACT

The present disclosure provides high-purity semi-insulating single-crystal silicon carbide wafer and crystal which include one polytype single crystal. The semi-insulating single-crystal silicon carbide wafer has silicon vacancy inside, wherein the silicon-vacancy concentration is greater than 5E11 cm^-3.

16 Claims, 13 Drawing Sheets

HIGH-PURITY SEMI-INSULATING SINGLE-CRYSTAL SILICON CARBIDE WAFER AND CRYSTAL

CROSS REFERENCE TO RELATED DISCLOSURE

This application claims the priority benefit of Taiwan Patent Application Number 109120678, filed on Jun. 18, 2020, the full disclosure of which are incorporated herein by reference.

BACKGROUND

Technical Field

The application relates to the technical field of semi-insulating single-crystal silicon wafer and crystal, particularly to high purity semi-insulating single-crystal silicon carbide wafer and crystal with high silicon-vacancy concentration.

Related Art

Semiconductor materials have gone through three stages of development. The first generation is about basic functional materials of silicon (Si), germanium (Ge), etc.; the second generation is about compound semiconductor materials composed of two or more elements, wherein gallium arsenide (GaAs), indium phosphide (InP), etc. are representative; the third generation is about compound semiconductor materials such as gallium nitride (GaN) and silicon carbide (SiC). The semiconductor materials of the third generation are materials with wide energy band gaps, which have the advantages of high frequency, high voltage resistivity, and high-temperature resistivity. The semiconductor materials of the third generation have good electrical conductivity and heat dissipation to reduce energy consumption. The volume of elements comprised the semiconductor materials of the third generation is relatively small, thereby suitable for power semiconductor applications. However, controlling the production conditions of silicon carbide is difficult, which makes the mass production of silicon carbide wafers difficult. Thereby, the development of terminal wafers and applications is affected directly.

Physical vapor transport (PVT) is currently the mainstream method for the commercial mass production of silicon carbide crystal. Generally, the process of growing silicon carbide crystals by the physical vapor transmission method is: preparing a seed and placing the seed in a crucible includes a growth chamber, a holder, and a material source container, wherein the holder is disposed above the growth chamber and used for fixing the seed, the holder is disposed at the relatively cold end of the thermal field device that provides the temperature gradient, and the material source container is disposed below the growth chamber to contain the material source; placing the carbide material in the material source container; sublimating the carbide material from solid to gas molecules; and transporting and depositing the sublimated gas molecules on the seed to grow the crystal.

In order to manufacture a high-resistivity silicon carbide wafer, the high-purity raw materials and deep-level dopants such as vanadium doping are mainly used in the prior art. Further, the reactive gas and shallow-level conduction elements are provided in the annealing process or neutron bombardment during the crystal growth process to make the wafer have high resistivity characteristic. However, when the size of the crystal is increased, the uniform resistivity and yield of large-sized crystals are not sufficiently provided by the prior art method. Therefore, the process cost is increased. In addition, due to the factors of crystal growth equipment, crystals with larger sizes (for example, larger than 4 inches) are more difficult to produce, and the yield rate is not easy to improve.

SUMMARY

Given the defect of the above-mentioned prior art, the present application provides semi-insulating single-crystal silicon carbide wafer and crystal which are large-size, high-resistivity, and less-defect, particularly to high-purity semi-insulating single-crystal silicon carbide wafer and crystal with high silicon-vacancy concentration.

A semi-insulating single-crystal silicon carbide wafer according to an embodiment of the present application comprise one polytype single-crystal, wherein the semi-insulating single-crystal silicon carbide wafer has silicon vacancy inside, and the silicon-vacancy concentration is at least greater than 5E11 cm^-3.

The high resistivity characteristic of the large-size high-purity semi-insulating single-crystal silicon carbide wafer or crystal disclosed in the present application is dominated by the concentration of crystal intrinsic defects (i.e. silicon vacancy) generated in the crystal growth process. Therefore, the additional annealing process or neutron bombardment process is unneeded to implemented to the wafer. In the prior art, the silicon-vacancy concentration of silicon carbide is about 2E11 cm^-3 to 3E11 cm^-3. The silicon-vacancy concentration of the silicon carbide wafer or silicon carbide crystal disclosed in the present application is at least greater than 5E11 cm^-3.

Other advantages of the present application will be explained in more detail with the following descriptions and figures.

It should be understood, however, that this summary may not contain all aspects and embodiments of the present invention, that this summary is not meant to be limiting or restrictive in any manner, and that the invention as disclosed herein will be understood by one of ordinary skill in the art to encompass obvious improvements and modifications thereto.

BRIEF DESCRIPTION OF THE DRAWINGS

The figures described herein are used to provide a further understanding of the application and constitute a part of the application. The exemplary embodiments and descriptions of the application are used to illustrate the application and do not limit the application, in which.

DETAILED DESCRIPTION OF THE EMBODIMENTS

Figure 1:
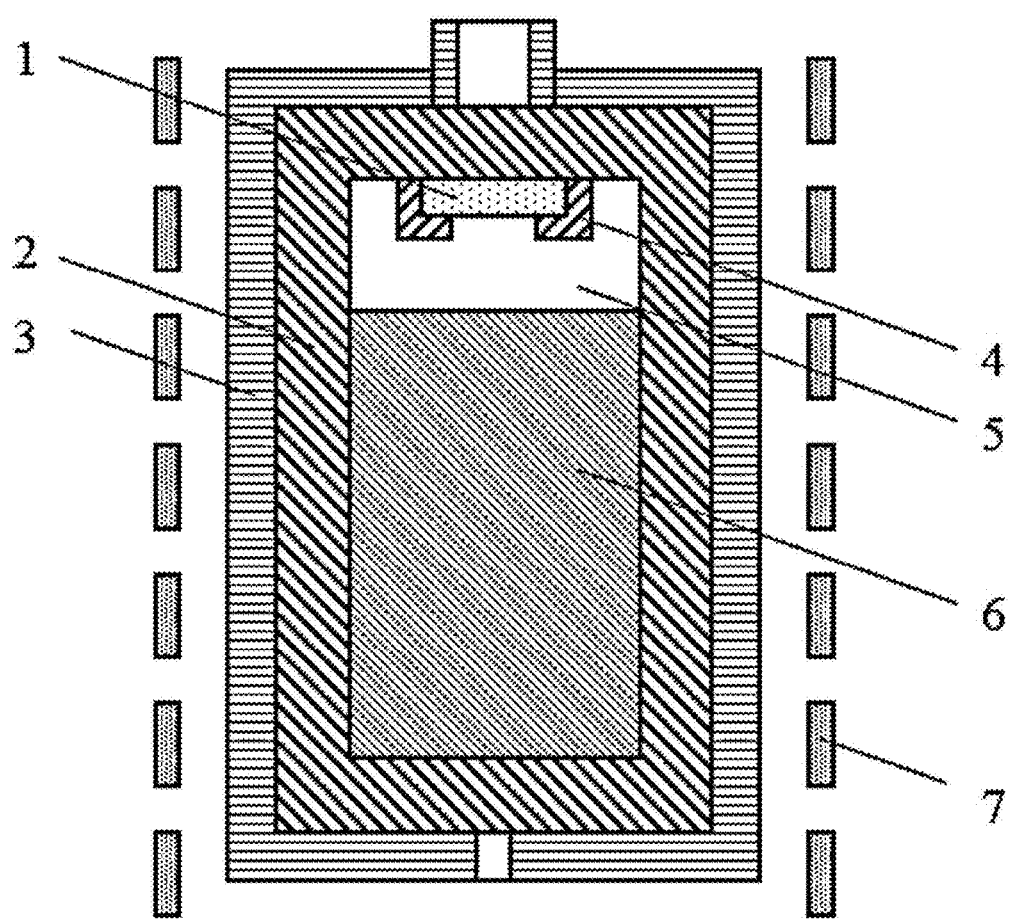
FIG. 1 is a schematic diagram of the growth system for growing high-purity semi-insulating single-crystal silicon carbide crystal according to the present application.

In order to make the objectives, technical solutions, and advantages of the present application clearer, the technical solutions of the application will be described clearly and completely in conjunction with specific embodiments and the figures of the application. Obviously, the described embodiments are only a part of the embodiments of the application, rather than all the embodiments. Based on the embodiments in the application, all other embodiments obtained by a person of ordinary skill in the art without creative work fall within the protection scope of this disclosure.

The following description is of the best-contemplated mode of carrying out the invention. This description is made for the purpose of illustrating the general principles of the invention and should not be taken in a limiting sense. The scope of the invention is best determined by reference to the appended claims.

Certain terms are used throughout the description and following claims to refer to particular components. As one skilled in the art will appreciate, manufacturers may refer to a component by different names. This document does not intend to distinguish between components that differ in name but function. "Substantial/substantially" means, within an acceptable error range, the person skilled in the art may solve the technical problem in a certain error range to achieve the basic technical effect.

Moreover, the terms "include", "contain", and any variation thereof are intended to cover a non-exclusive inclusion. Therefore, a process, method, object, or device that comprises a series of elements not only include these elements, but also comprises other elements not specified expressly, or may include inherent elements of the process, method, object, or device. If no more limitations are made, an element limited by "include a/an . . . " does not exclude other same elements existing in the process, the method, the article, or the device which comprises the element.

In the following embodiment, the same reference numerals are used to refer to the same or similar elements throughout the invention.

The present application discloses a high-purity semi-insulating single-crystal silicon carbide crystal with large-size, high-resistivity, and low-defect, which is grown in a high-purity single-crystal system by physical vapor transport (PVT). By controlling the Si/C ratio and particle size distribution of the high-purity crystal growth raw material, and the crystal growth temperature and time during the crystal growth process, the system becomes a carbon-rich (C-rich) environment. In a state where shallow-level conductive elements are scarce, the intrinsic defect of silicon vacancy may be generated in the crystal and the silicon-vacancy concentration may be controlled. The intrinsic defect is used to increase the resistivity of the crystal in order to make the wafer semi-insulate. In addition, the possibility of introducing impurities into the crystal is eliminated during the crystal growth process due to the high-purity raw material. Therefore, the present application discloses a high-purity semi-insulating single-crystal silicon carbide bulk material with a micro-pipe defect less than 3 cm^-2.

"Large size" mentioned here refers to a high-purity semi-insulating single-crystal silicon carbide wafer with a diameter of at least 4 inches, or 4 inches to 6 inches, and a thickness of at least 350 μm. "High purity" refers to the purity of the raw material used for grown crystal is higher than 99.99%. "High resistivity" refers to the resistivity is greater than 1E7 ohm-cm or at least 1E7 ohm-cm at room temperature. In addition, the crystal refers to a silicon carbide crystal manufactured by a silicon carbide growth system in the embodiments of the specification, and the finished product after cutting the silicon carbide crystal is generally called a wafer.

The high resistivity characteristics of the high-purity semi-insulating single-crystal silicon carbide crystal or silicon wafer of the present application are controlled by the concentration of intrinsic defect (silicon vacancy) in the crystal or wafer. The silicon vacancy is generated during the crystal growth process. An additional annealing process or neutron bombardment process is unnecessary thereby simplifying the manufacturing process.

Refer to FIG. 1, which is a schematic diagram of the growth system for growing high-purity semi-insulating single-crystal silicon carbide crystal according to the present application. As shown in the figure, the growth system comprises a crucible 2, a thermal insulation material 3, and a heater 7. The crucible 2 is used to contain a seed 1 which grows through a material source 6. The thermal insulation material 3 is disposed on the outside of the crucible 2. The thermal insulation material 3 shown in the figure covers the outside of the crucible 2, but the thermal insulation material 3 does not have to substantially cover the outside of the crucible 2, as long as the temperature may be maintained. Therefore, the figure is only exemplary. The heater 7 is used to provide a heat source. The number of the heater 7 shown in the figure is multiple, but the number of the heater 7 may also be provided in one depending on the system configuration. The number of the heater 7 in the figure is only for the purposes of exemplary and does not limit the real number of heater 7. A high-frequency heater or a resistivity heater may be used as the heater 7. In a more specific embodiment, a heating coil or heating resistivity wire (net) may be used as the heater 7.

A holder 4 is disposed above the inside of the crucible 2, and the holder 4 is used to fix the seed 1. The material source 6 may be disposed below the crucible 2, and the space between the seed 1 and the material source 6 may be used as a growth area 5 for silicon carbide crystal. The area where the seed 1 is placed may be defined as the seed area, and the area where the material source 6 is placed may be defined as the material source area. Therefore, the empty crucible 2 has a seed area, a material source area, and a growth area inside. In a non-limiting embodiment, the crucible 2 may be a graphite crucible, and the thermal insulation material 3 may be a graphite blanket or a porous thermal insulation carbon material.

In the embodiment, the seed may be silicon carbide. The seed used in the present application may be a single-crystal wafer with a thickness of 350 μm or more and a diameter of 4 inches to 6 inches or more to grow a single-crystal with the corresponding size or more. The single-crystal wafer may be silicon carbide. The material source area in the crucible may be silicon carbide. The material source may be powdery, granular, or massive and have a purity of more than 99.99%. The crystalline phase of the material source may be a or β, and the ratio of silicon/carbon may be 0.95 to 1.05.

By controlling the temperature distribution, the atmosphere flow, and the sublimation process of the material source in the crucible 2 with the structure of the crucible 2, the structure of the thermal-material 3, and the heater 7, the sublimated gas molecules are transported and deposited on the seed 1 (wafer) to generate silicon carbide crystal. In an embodiment of the growth process, the temperature difference between the bottom of the crucible to the seed area is controlled in the range of 10° C. to 300° C., the flow rate of argon gas is controlled in the range of 100 sccm to 1000 sccm, the pressure is controlled in the range of 1 torr to 200 torrs, and the temperature range of the seed during crystallization is controlled between 2000° C. and 2270° C. Controlling the purity and type of the material source, and the temperature range and time of growth are the most important. After the conductive elements inside the system are consumed, the electrical performance of the crystal may be majorly dominated by the intrinsic defect generated inside the crystal.

The high-purity semi-insulating single-crystal silicon carbide crystal formed by the growth system of the above embodiment is grown by depositing a vapor material containing Si and C on the surface of the seed. The high-purity semi-insulating single-crystal silicon carbide crystal comprises one polytype single-crystal. The high-purity semi-insulating single-crystal silicon carbide crystal has silicon vacancy inside, wherein the silicon-vacancy concentration is at least greater than $5E11$ $cm^{-3}$ and less than $5E13$ $cm^{-3}$. In the prior art, the concentration of silicon vacancy in silicon carbide wafer is about $2E11$ $cm^{-3}$ to $3E11$ $cm^{-3}$ generally.

In one embodiment, the high-purity semi-insulating single-crystal silicon carbide crystal formed by the growth system according to the above embodiment has a diameter greater than or equal to 90 mm.

In one embodiment, the diameter of the high-purity semi-insulating single-crystal silicon carbide crystal formed by the growth system according to the above embodiment is less than or equal to 200 mm.

In one embodiment, the high-purity semi-insulating single-crystal silicon carbide crystal formed by the growth system according to the above embodiment has a resistivity greater than 1E7 ohm-cm.

In one embodiment, the high-purity semi-insulating single-crystal silicon carbide crystal formed by the growth system according to the above embodiment has a micro-pipe density of less than 3 per square centimeter.

In one embodiment, the high-purity semi-insulating single-crystal silicon carbide crystal formed by the growth system according to the above embodiment has a micro-pipe density of less than 2 per square centimeter.

In one embodiment, the high-purity semi-insulating single-crystal silicon carbide crystal formed by the growth system according to the above embodiment has a micro-pipe density of less than 1 per square centimeter.

In one embodiment, the high-purity semi-insulating single-crystal silicon carbide crystal formed by the growth system according to the above embodiment has a micro-pipe density of less than 0.4 per square centimeter.

In one embodiment, the high-purity semi-insulating single-crystal silicon carbide crystal formed by the growth system according to the above embodiment has a micro-pipe density of less than 0.1 per square centimeter.

In one embodiment, the high-purity semi-insulating single-crystal silicon carbide crystal formed by the growth system according to the above embodiment comprises one polytype single-crystal selected from 3C, 4H, 6H, and 15R polymorphs of silicon carbide, wherein the 4H polymorph is the most preferred currently. The wafer may be selected from 3C, 4H, 6H, and 15R polymorphs of silicon carbide, wherein the 4H polymorph is the most preferred currently. The wafer obtained is oriented along an axis, such as a positive axis orientation, or a variety of off-axis orientations. For example (but not limited to), the wafer is selected from 4°, 3.5°, and 2°.

In one embodiment, the thickness of the high-purity semi-insulating single-crystal silicon carbide crystal formed by the growth system according to the above embodiment is at least 8 mm.

In one embodiment, the thickness of the high-purity semi-insulating single-crystal silicon carbide crystal formed by the growth system according to the above embodiment is 8 mm to 30 mm.

The following embodiment illustrates the specific manufacturing process of the high-purity semi-insulating single-crystal silicon carbide crystal disclosed in the present application. Through physical vapor transport (PVT), using high-purity growth materials and components, and adjusting process window and time, the manufacturing process is not only effectively inhibiting impurities and conductive elements from entering the crystal during the crystal growth process but improving the quality of the crystal. By thermal field optimization and process control, the overall crystal growth surface is flatter, and the intrinsic defect concentration of the crystal is increased. Thereby, the resistivity of 1E7 ohm-cm of the silicon carbide crystal with 4 to 6 inches is achieved.

The first embodiment illustrates growing a 6-inch single-crystal silicon carbide crystal by using the growth system of FIG. 1. The material used in the present embodiment is high-purity silicon carbide powder with a purity of 99.99% or more. The average particle size is 5 mm to 20 mm. The initial silicon/carbon ratio is 1. After the crystal growing, the silicon/carbon ratio of the remaining material drops to 0.85.

The 4H—SiC single-crystal is manufactured by the PVT method with the above-mentioned silicon carbide source.

The growth process is performed in a graphite crucible in a high-temperature vacuum induction furnace. The growth temperature of the seed is about 2100° C. Ar is used as the carrier gas for the system. The pressure during crystal growth of the system is about 5 torr, and the growth time is 150 hours. A silicon carbide single crystal wafer of about 500 μm is used as a seed.

First, perform an air extraction process, and fix the 4H—SiC seed with a holder. Then, extract air to remove air and other impurities in the crucible system. After extracting the air, perform a heating process. During the heating process, add the inert gas Ar as auxiliary gas, and use the heating coil to heat the entire system. Heat to about 2100° C. and continually grow for up to 150 hours. Through the process conditions of the first embodiment, a 6-inch single-crystal silicon carbide boule with a convex interface shape may be produced, and the crystal growth rate may achieve 100-250 μm/hr.

Figure 2:
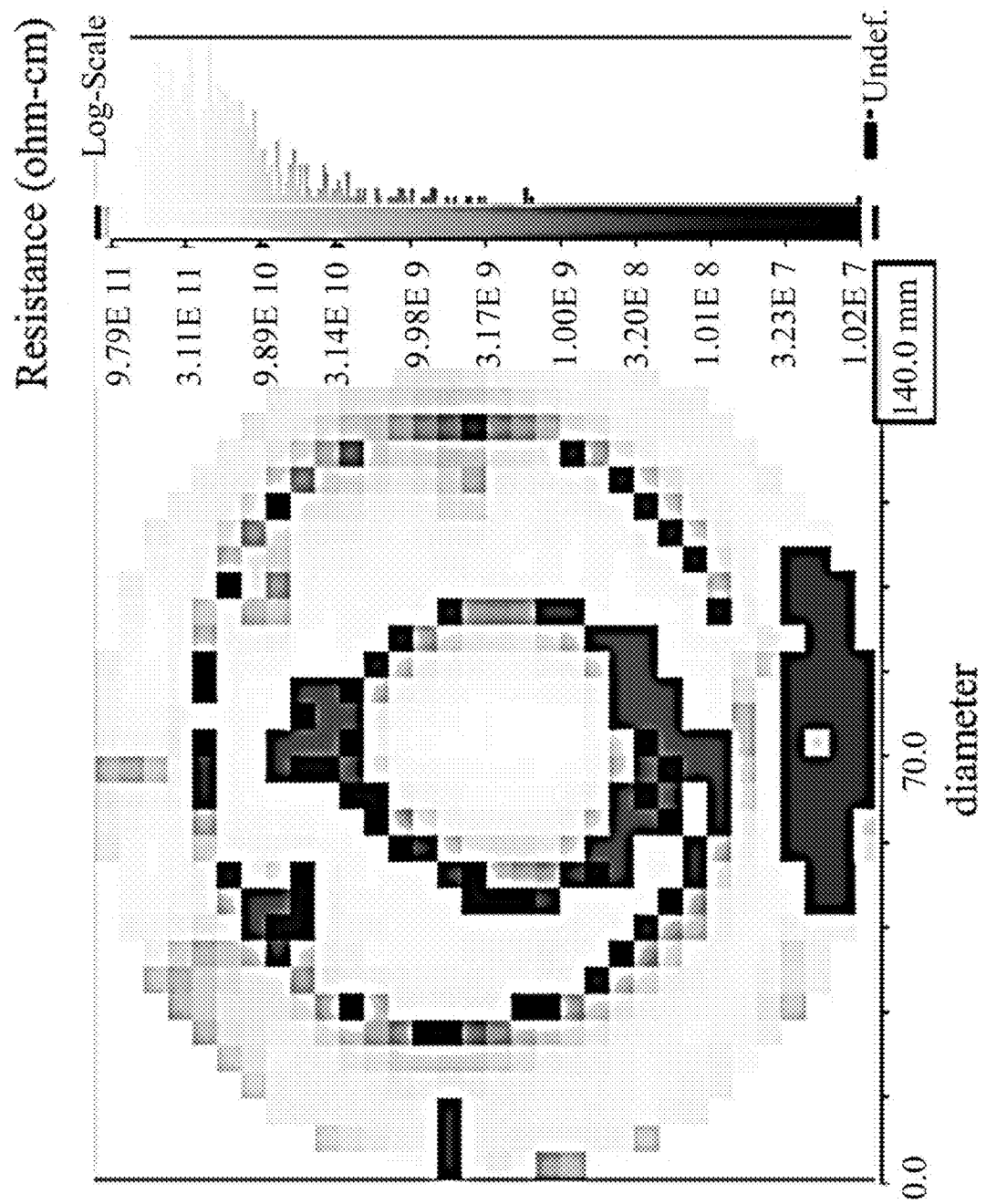
FIG. 2 is a measurement result of the resistivity of the high-purity semi-insulating single-crystal silicon carbide crystal according to the first embodiment of the present application.

The resistivity, micro-pipe density, impurity elements, or silicon vacancy of the crystal after growing may be measured. The crystal after growing is sliced and polished to obtain a wafer. The wafer may be measured for resistivity without annealing. An area with a diameter of 140 mm at the center of the 6-inch wafer is measured, the resistivity values are all greater than 1E7 ohm-cm, as shown in FIG. 2.

Figure 3:
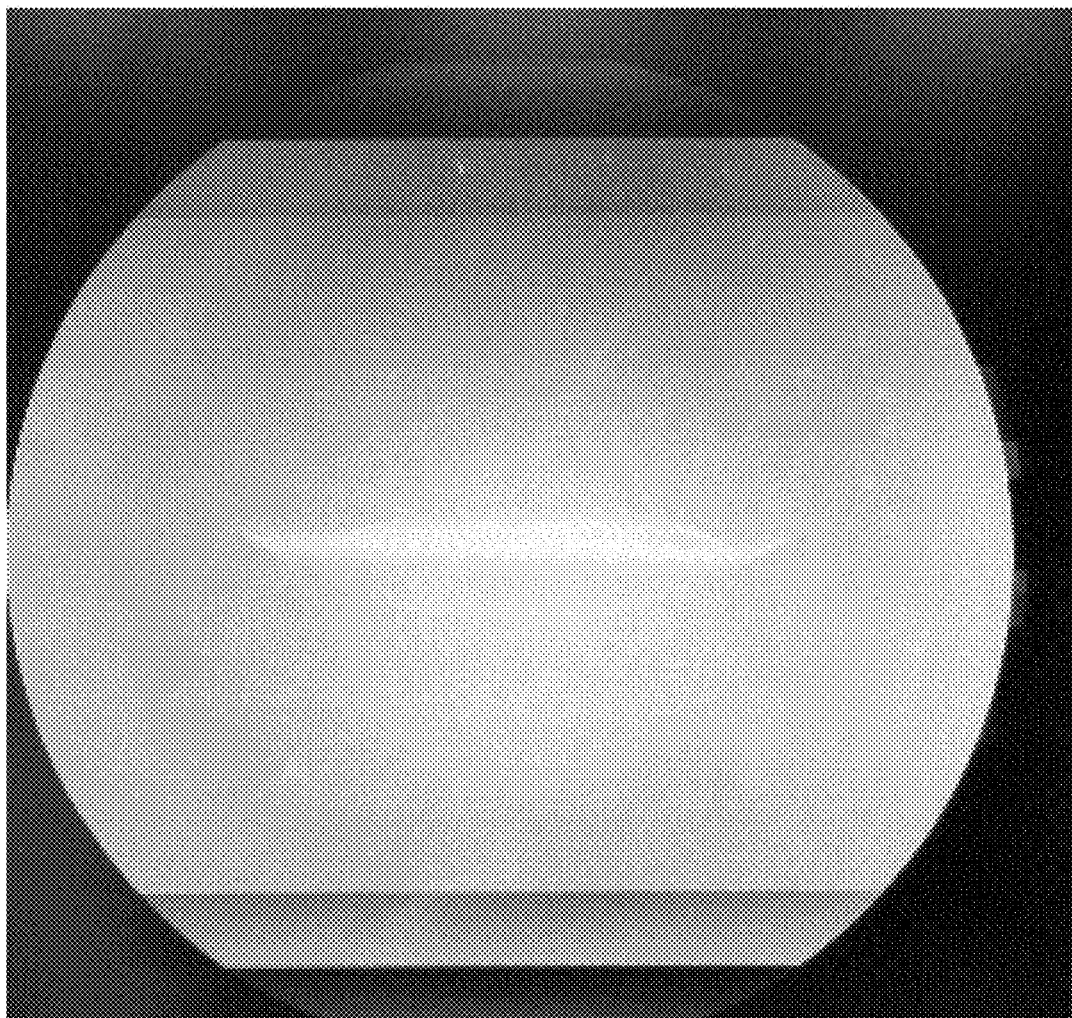
FIG. 3 is a schematic diagram of the micro-pipe density of the high-purity semi-insulating single-crystal silicon carbide crystal according to the first embodiment of the present application.

Analyze the 6-inch wafer with X-ray topography. As the result, the number of micro-pipes is 10. Furthermore, the overall density of 6-inch micro-pipes is the number of micro-pipes/6 inch wafer area, which is $10/(7.5*7.5*3.1416)=10/176.75=0.056$. That is, the micro-pipe density in this embodiment is less than 0.1 per square centimeter, as shown in FIG. 3.

Analyze the impurity elements of the 6-inch wafer with Glow Discharge Mass Spectrometer (GDMS) and Secondary Ion Mass Spectroscopy (SIMS), the results of the following table may be obtained. Wherein, the N element is measured by SIMS, and other elements are measured by GDMS. Two units of ppm and ion concentration are provided. The content of conductive impurity elements in the crystal is less than 5E15 cm^-3.

| Crystal number element | Example 1 GDMS (ppm/cm^-3) |
|---|---|
| N | SIMS: 4.30E+15 |
| B | 0.02 (3.76E+15) |
| Al | 0.04 (2.87E+15) |
| P | <0.05 (<3.14E+15) |
| Ti | <0.01 (<4.04E+14) |
| V | <0.01 (<3.38E+14) |
| Fe | <0.1 (<3.46E+15) |
| Ni | <0.05 (<1.67E+15) |

Figure 4:
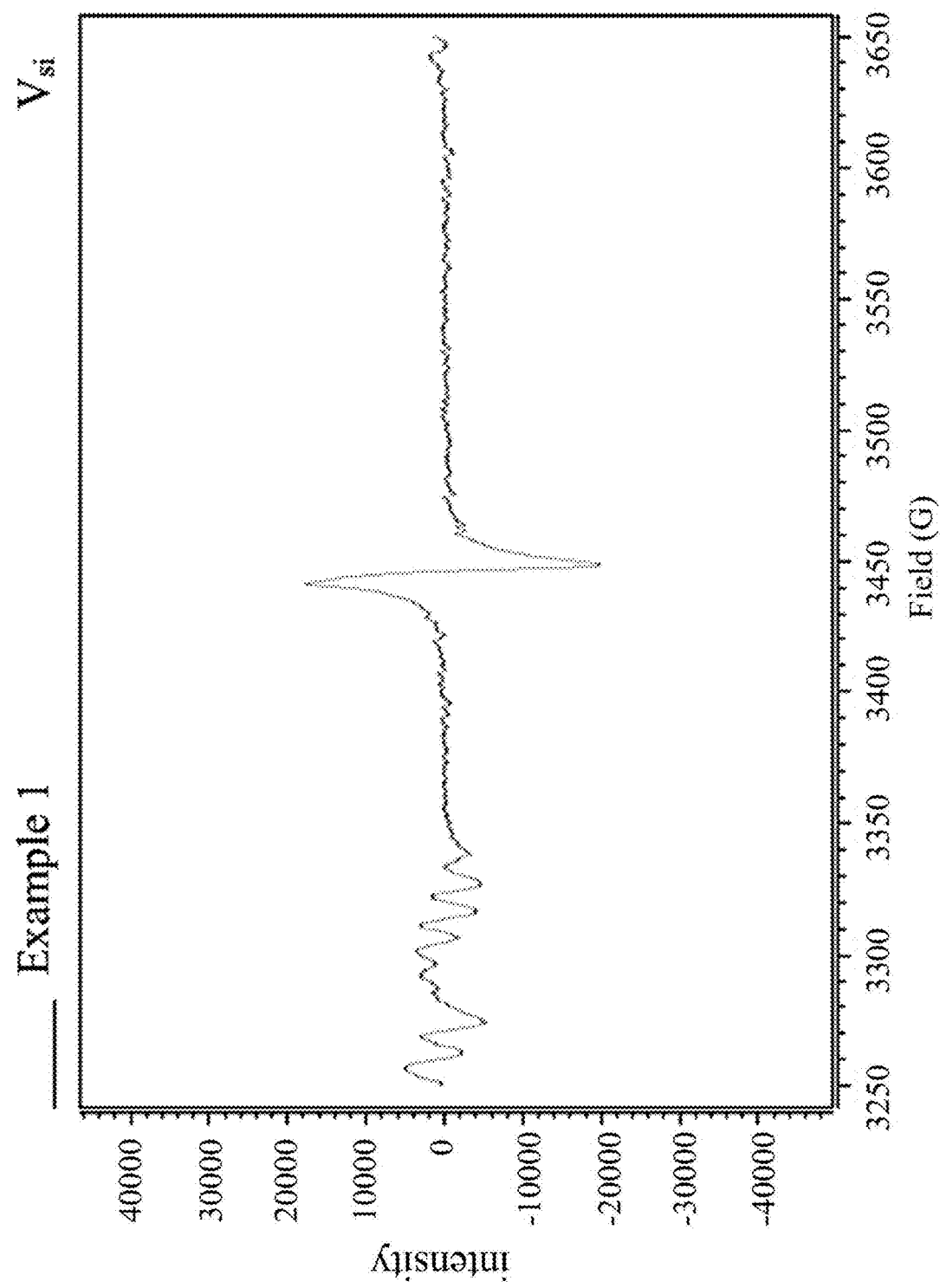
FIG. 4 is an electron paramagnetic resonance spectrum of the high-purity semi-insulating single-crystal silicon carbide crystal according to the first embodiment of the present application.

Analyze the 6-inch wafer with the electron paramagnetic resonance (EPR). The spectroscopy shows that the main defect in the crystal is silicon vacancy. As shown in FIG. 4, the results of the optical inspection are used to show the silicon-vacancy concentration. The silicon-vacancy concentration is from 5.22E11 cm^-3 to 1.02E12 cm^-3.

The second embodiment illustrates growing a 4-inch single-crystal silicon carbide boule by using the growth system of FIG. 1. The material used in the present embodiment is high-purity silicon carbide powder with a purity of 99.99% or more. The average particle size is 100 mm to 30 mm. The initial silicon/carbon ratio is 1. After the crystal growing, the silicon/carbon ratio of the remaining material drops to 0.87.

The 4H—SiC single-crystal is manufactured by the PVT method with the above-mentioned silicon carbide source. The growth process is performed in a graphite crucible in a high-temperature vacuum induction furnace. The growth temperature of the seed is about 2180° C. Ar is used as the carrier gas for the system. The pressure during crystal growth of the system is about 5 torr, and the growth time is 200 hours. A silicon carbide single crystal wafer of about 500 μm is used as a seed.

First, perform an air extraction process, and fix the 4H—SiC seed with a holder. Then, extract air to remove air and other impurities in the crucible system. After extracting the air, perform a heating process. During the heating process, add the inert gas Ar as auxiliary gas, and use the heating coil to heat the entire system. Heat to about 2100° C. and continually grow for up to 150 hours. Through the process conditions of the first embodiment, a 6-inch single-crystal silicon carbide boule with a convex interface shape may be produced, and the crystal growth rate may achieve 100-250 μm/hr.

Figure 5:
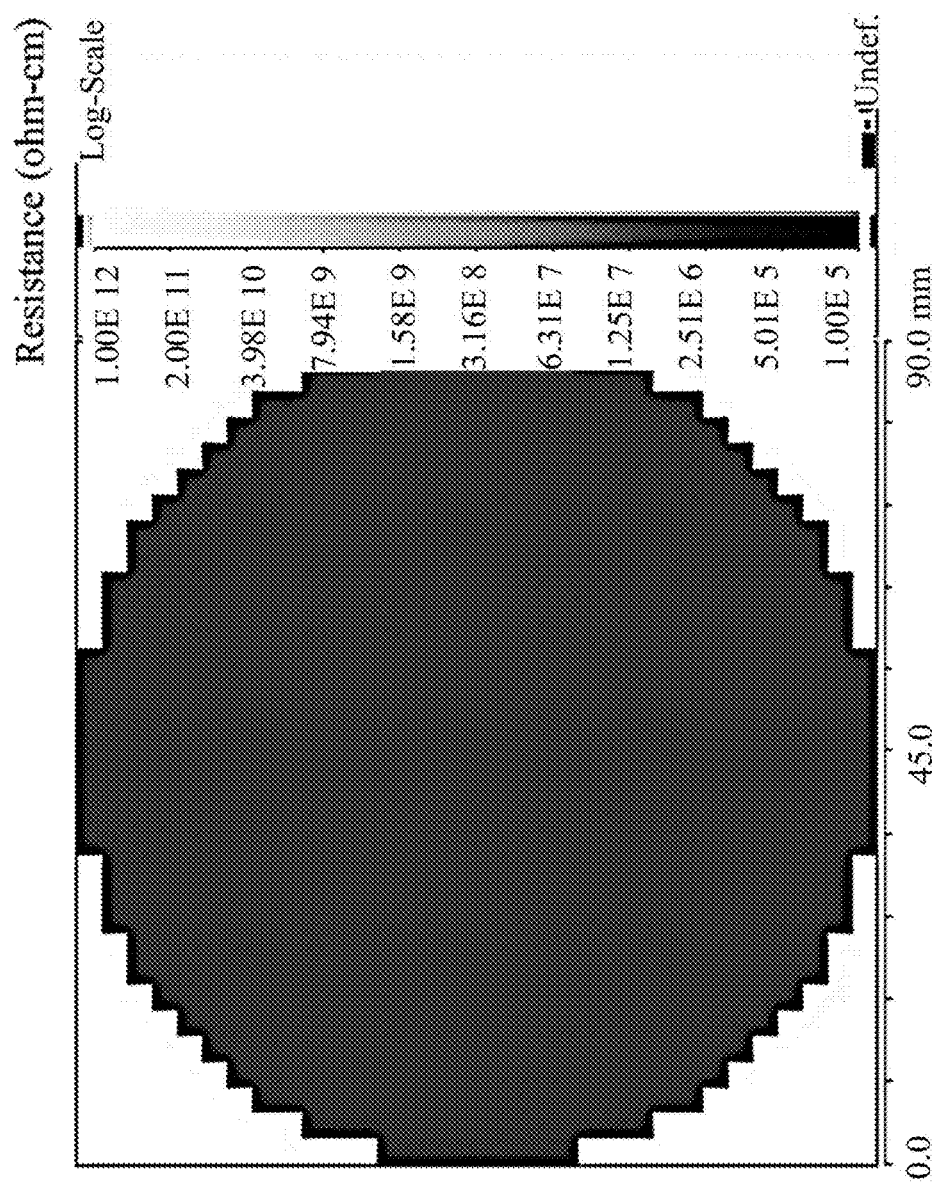
FIG. 5 is a measurement result of the resistivity of the high-purity semi-insulating single-crystal silicon carbide crystal according to the second embodiment of the present application.

The resistivity, micro-pipe density, impurity elements, or silicon vacancy of the crystal after growing may be measured. The crystal after growing is sliced and polished to obtain a wafer. The wafer may be measured for resistivity without annealing. An area with a diameter of 140 mm at the center of the 6-inch wafer is measured, the resistivity values are all greater than 1E7 ohm-cm, as shown in FIG. 5.

Figure 6:
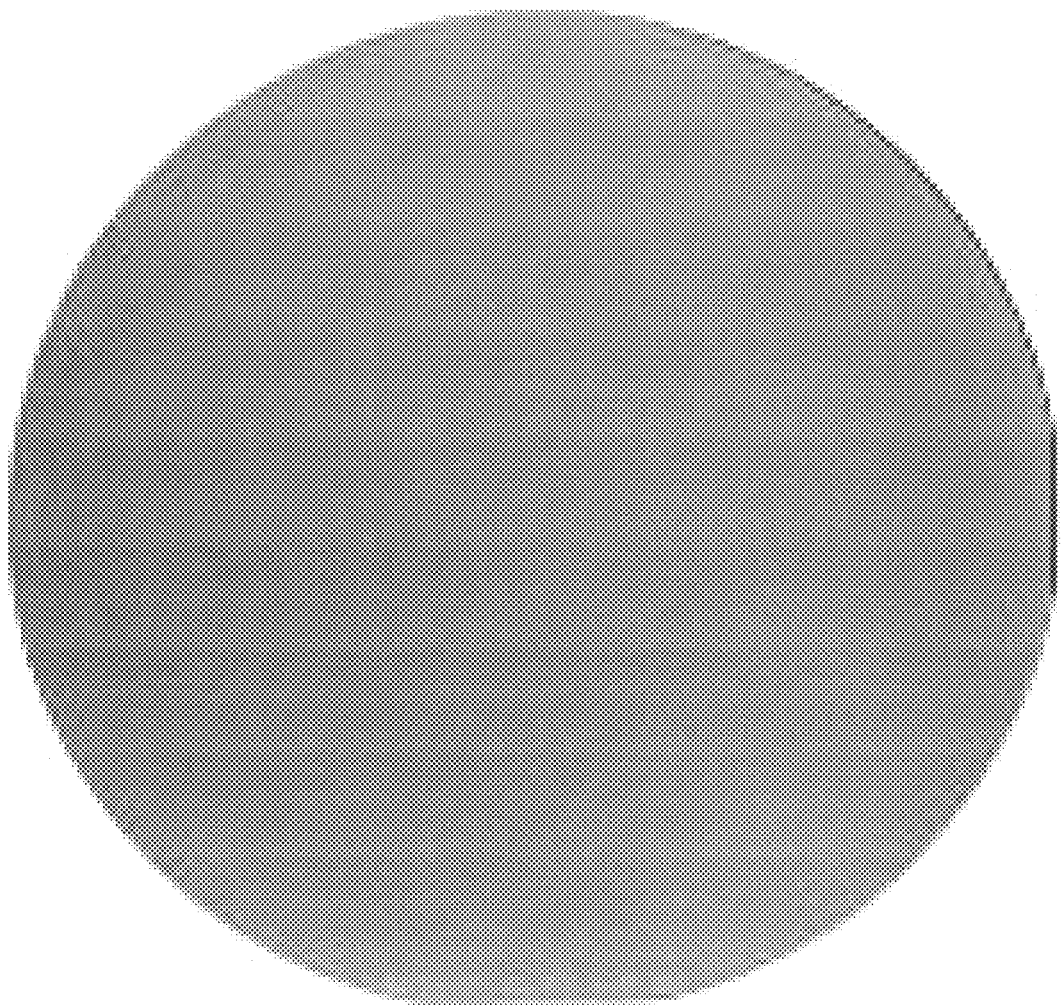
FIG. 6 is a schematic diagram of the micro-pipe density of the high-purity semi-insulating single-crystal silicon carbide crystal according to the second embodiment of the present application.

Analyze the 6-inch wafer with X-ray topography. As the result, the number of micro-pipes is 1. Furthermore, the overall density of 4-inch micro-pipes is the number of micro-pipes/4 inch wafer area, which is $1/(5*5*3.1416)=1/78.54=0.012$. That is, the micro-pipe density in this embodiment is less than 0.02 per square centimeter, as shown in FIG. 6.

Analyze the impurity elements of the 6-inch wafer with Glow Discharge Mass Spectrometer (GDMS) and Secondary Ion Mass Spectroscopy (SIMS), the results of the following table may be obtained. Wherein, the N element is measured by SIMS, and other elements are measured by GDMS. Two units of ppm and ion concentration are provided. The content of conductive impurity elements in the crystal is less than 5E15 cm^-3.

| Crystal number element | Example 2 GDMS (ppm/cm^-3) |
|---|---|
| N | SIMS: 1.90E+15 |
| B | 0.04 (6.93E+15) |
| Al | 0.03 (2.10E+15) |
| P | <0.05 (<3.14E+15) |
| Ti | <0.01 (<4.04E+14) |
| V | <0.01 (<3.38E+14) |
| Fe | <0.1 (<3.46E+15) |
| Ni | <0.05 (<1.67E+15) |

Figure 7:
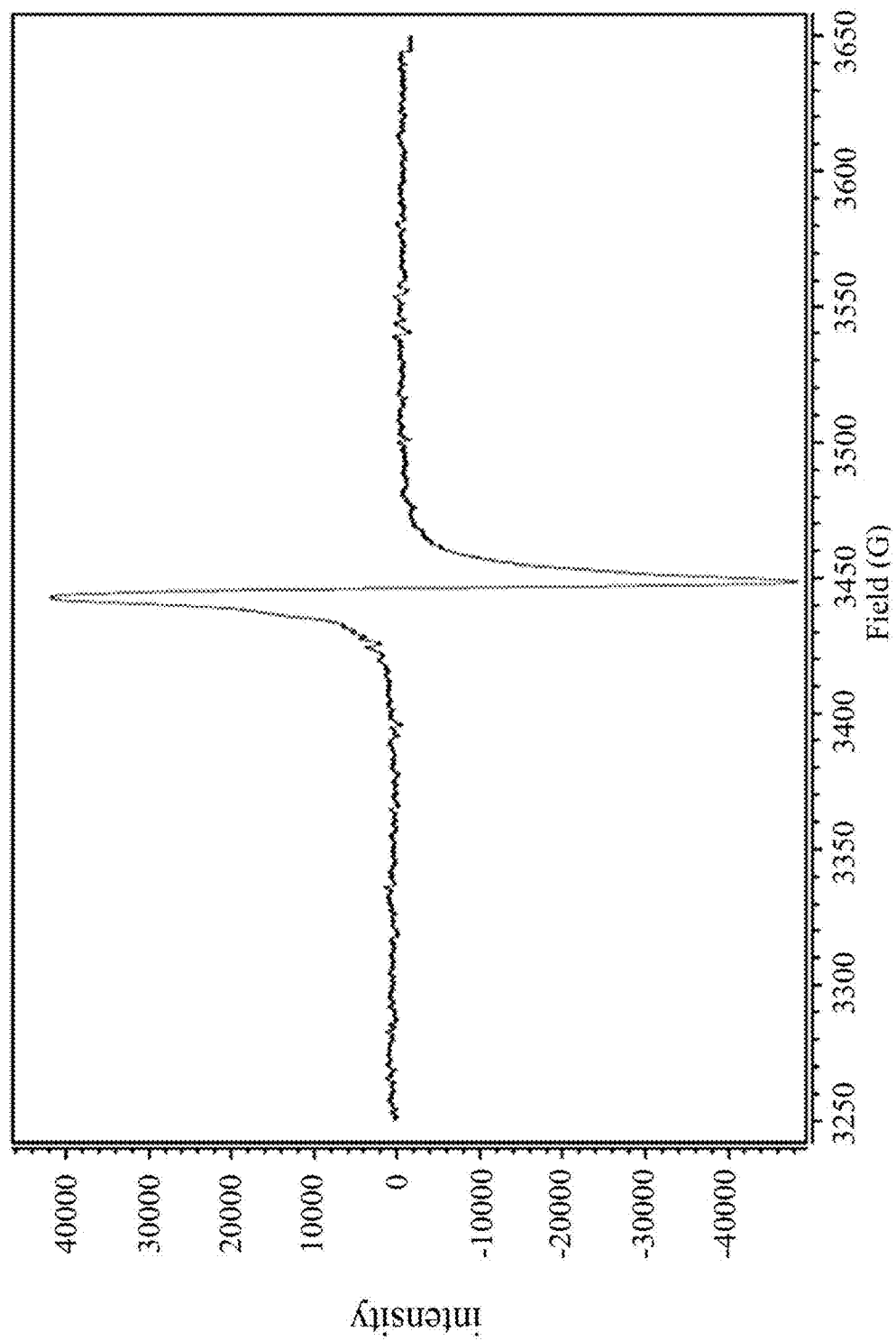
FIG. 7 is an electron paramagnetic resonance spectrum of the high-purity semi-insulating single-crystal silicon carbide crystal according to the second embodiment of the present application.

Analyze the 4-inch wafer with the electron paramagnetic resonance (EPR). The spectroscopy shows that the main defect in the crystal is silicon vacancy. As shown in FIG. 7, the results of the optical inspection are used to show the silicon-vacancy concentration. The silicon-vacancy concentration is 7.07E12 cm^-3.

Figure 8:
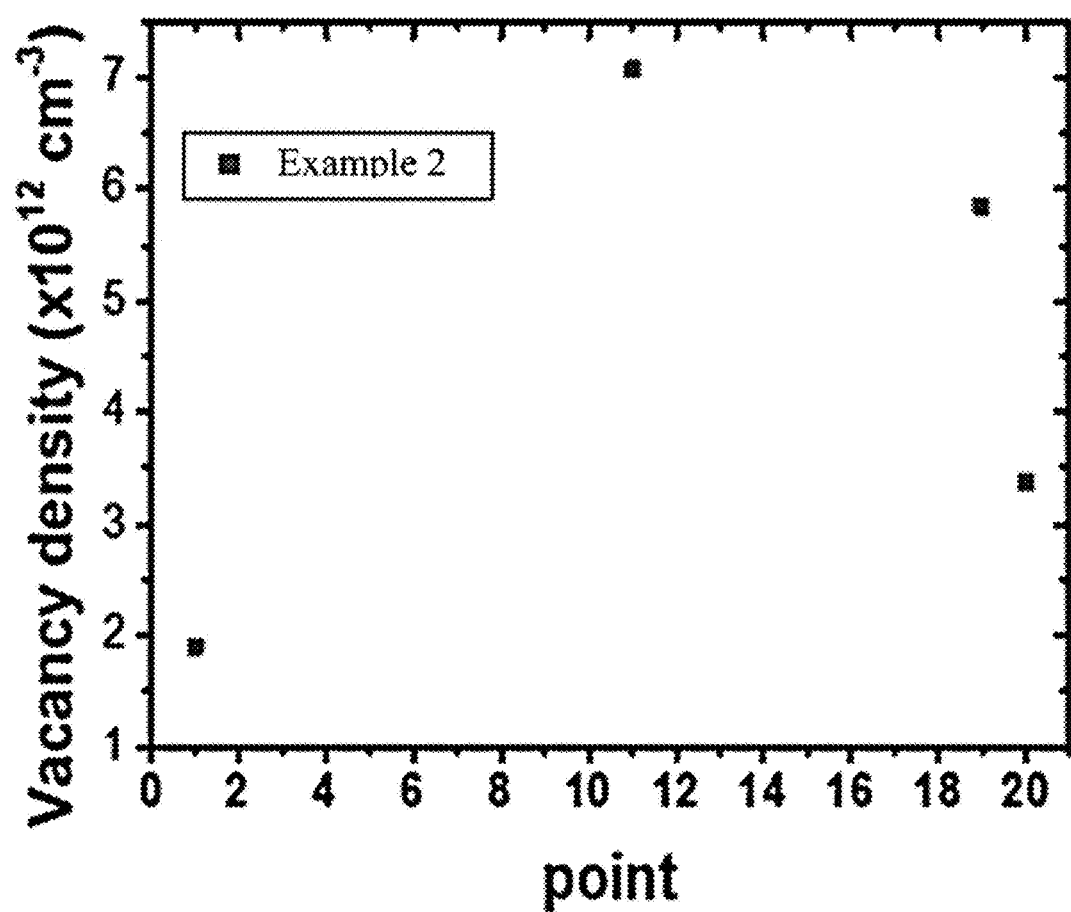
FIG. 8 is a schematic diagram of the silicon-vacancy concentration of the silicon carbide wafer according to the second embodiment of the present application.

Cut the crystal of the second embodiment, and analyze the silicon-vacancy concentration of the slices at different positions, as shown in FIG. 8. Taking the growth system of FIG. 1 as an example, a total of 20 slices are cut, and the 20 slices respectively corresponding to the serial number on the horizontal axis of FIG. 8. Wherein the serial number of the slice closest to the seed is 1. From the seed to the growth surface, the silicon-vacancy concentrations respectively are 1.9E12 cm^-3, 7E12 cm^-3, 5.9E12 cm^-3, and 3.3 E12 cm^-3, respectively.

The high-purity semi-insulating single-crystal silicon carbide wafer according to the above embodiment comprises one polytype single-crystal. The high-purity semi-insulating single-crystal silicon carbide wafer has silicon vacancy inside, wherein the silicon-vacancy concentration is at least greater than 5E11 cm^-3, less than 5E13 cm^-3.

In one embodiment, the high-purity semi-insulating single-crystal silicon carbide wafer formed according to the above embodiment has a diameter greater than or equal to 90 mm.

In one embodiment, the diameter of the high-purity semi-insulating single-crystal silicon carbide wafer formed according to the above embodiment is less than or equal to 200 mm.

In one embodiment, the high-purity semi-insulating single-crystal silicon carbide wafer formed according to the above embodiment has a resistivity greater than 1E7 ohm-cm.

In one embodiment, the high-purity semi-insulating single-crystal silicon carbide wafer formed according to the above embodiment has a micro-pipe density of less than 3 per square centimeter.

In one embodiment, the high-purity semi-insulating single-crystal silicon carbide wafer formed according to the above embodiment has a micro-pipe density of less than 2 per square centimeter.

In one embodiment, the high-purity semi-insulating single-crystal silicon carbide wafer formed according to the above embodiment has a micro-pipe density of less than 1 per square centimeter.

In one embodiment, the high-purity semi-insulating single-crystal silicon carbide wafer formed according to the above embodiment has a micro-pipe density of less than 0.4 per square centimeter.

In one embodiment, the high-purity semi-insulating single-crystal silicon carbide wafer formed according to the above embodiment has a micro-pipe density of less than 0.1 per square centimeter.

In one embodiment, the high-purity semi-insulating single-crystal silicon carbide wafer formed according to the above embodiment comprises one polytype single-crystal selected from 3C, 4H, 6H, and 15R polymorphs of silicon carbide, wherein the 4H polymorph is the most preferred currently. The wafer may be selected from 3C, 4H, 6H, and 15R polymorphs of silicon carbide, wherein the 4H polymorph is the most preferred currently. The wafer obtained is oriented along an axis, such as a positive axis orientation, or a variety of off-axis orientations. For example (but not limited to), the wafer is selected from 4°, 3.5°, and 2°.

The wafer according to the present application is suitable for high-frequency power devices, high-power devices, high-temperature devices, optoelectronic devices, and deposition of group III nitrides.

The wafer according to the present application is suitable as a single-photon light source, that is, an integrated circuit substrate of a quantum computer.

Figure 9:
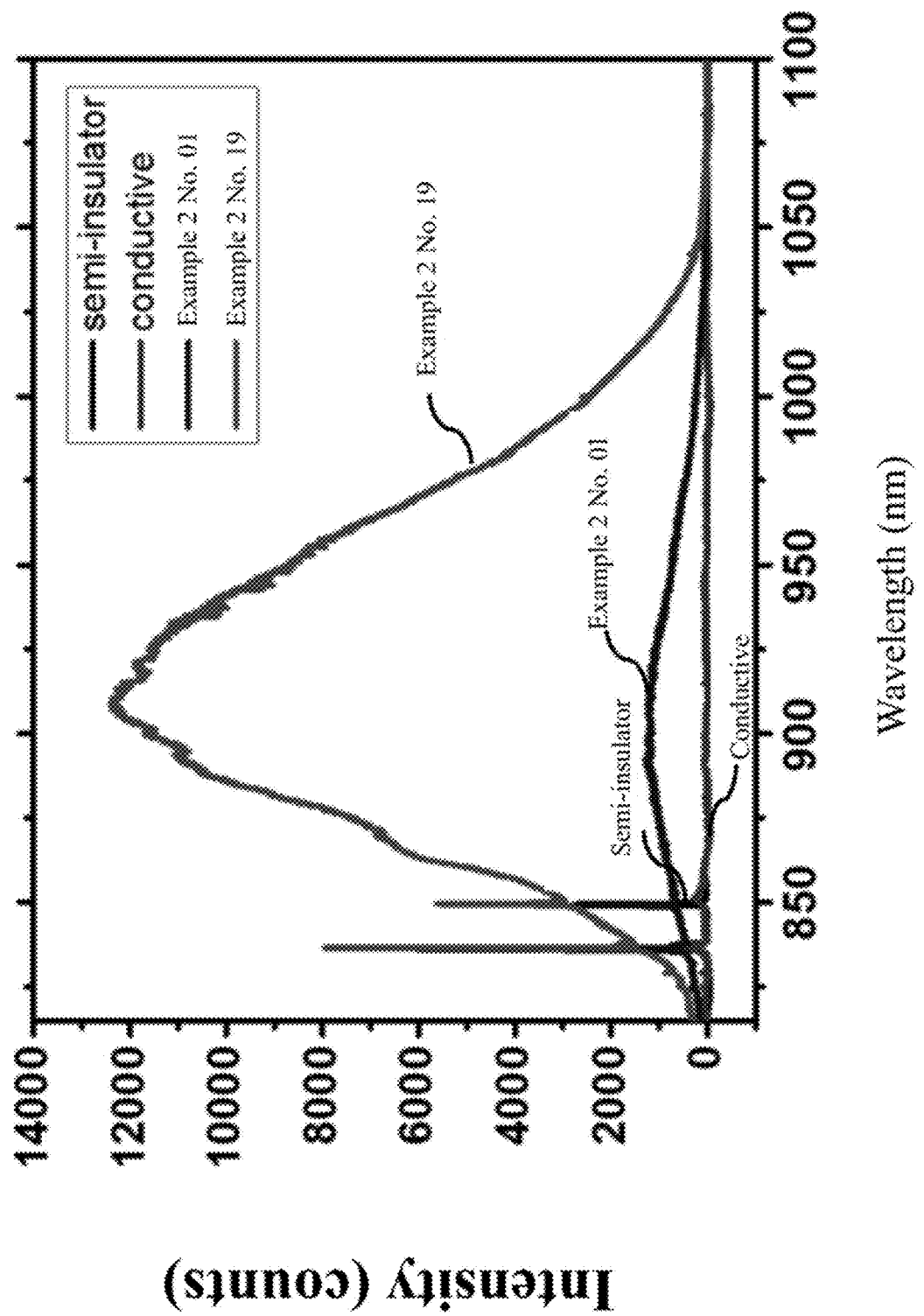
FIG. 9 is a photoluminescence spectrum of a silicon carbide wafer according to the second embodiment of the present application.

Refer to FIG. 9, the electron paramagnetic resonance (EPR) spectrum of the second embodiment is shown. The sample was cut into a size of 5.5 cm×7 mm and irradiated with a microwave of 9.70396×1E9 Hz. In the spectrum, the silicon carbide wafer produces a zero point at 3600.70343G at a temperature of 300K. After calculation by the formula $h\upsilon = g\mu_B B$ (h: Planck's constant, υ: frequency; g: g factor; $\mu_B$: Bohr magneton; B: magnetic field), the g factor of the No. 11 wafer of Example 2 is 2.00343. It means that the silicon vacancy is contained in silicon carbide (the signal of silicon vacancy is g=2.0032±0.0004).

Figure 10:
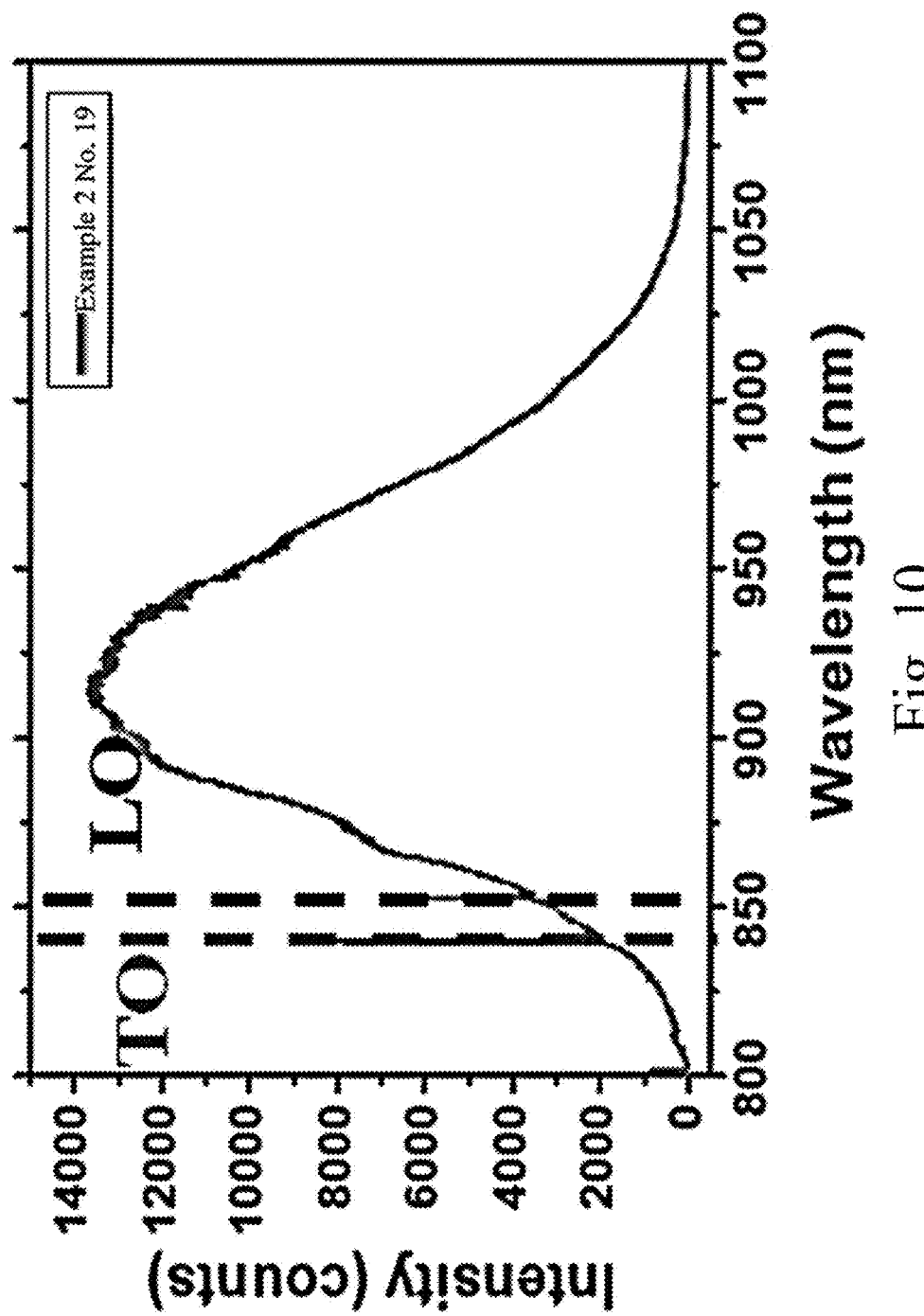
FIG. 10 is a photoluminescence spectrum of a silicon carbide wafer according to the second embodiment of the present application.

Refer to FIG. 10, which is the photoluminescence spectrum of the wafer of the second embodiment. Some Raman signals are not sensitive to the concentration of doping and the concentration of vacancy, for example, lateral-optical mode. For laser excitation of 785 nm, it is the LO mode at the 851 nm wavelength and the 4H—SiC TO mode at the 838 nm wavelength. In FIG. 9, the ratio of the photoluminescence to the Raman signal at LO mode (ratio (PL/LO)) of the No. 19 wafer of the second embodiment is 5.1. Therefore, the silicon-vacancy density of the second embodiment is about 5.1÷0.7=7.29 (×1E12 cm^-3). In fact, the intensity and wavenumber of the peak of the LO mode are greatly affected by the concentration of doping, and predicting the vacancy density of SiC through the ratio (PL/LO) is difficult. In order to measure SiC with different resistivity, the photoluminescence signal of TO mode is used to measure the silicon-vacancy concentration because of its stability in different wafers and the same measurement area as photoluminescence. In FIG. 9, the ratio of the photoluminescence to the Raman signal at the TO mode (ratio (PL/TO)) of the second embodiment is 4.50. As a result, the silicon-vacancy density in 4H—SiC may be calculated by the following formula: density of V_Si=PL/TO× 7.29÷4.47=PL/TO×1.63. The PL/TO ratio is the peak of corresponding excitation light divided by the peak of the Raman scattering at TO mode in the excitation spectrum (near 840 nm). Therefore, the silicon-vacancy density per unit lattice generating silicon-vacancy electroluminescence may be calculated (1 PL/TO→1.630*10^12/cm^3).

The first embodiment was tested in the same method, and the maximum average vacancy density in the series was 3.26×1E12 cm^-3.

Figure 11:
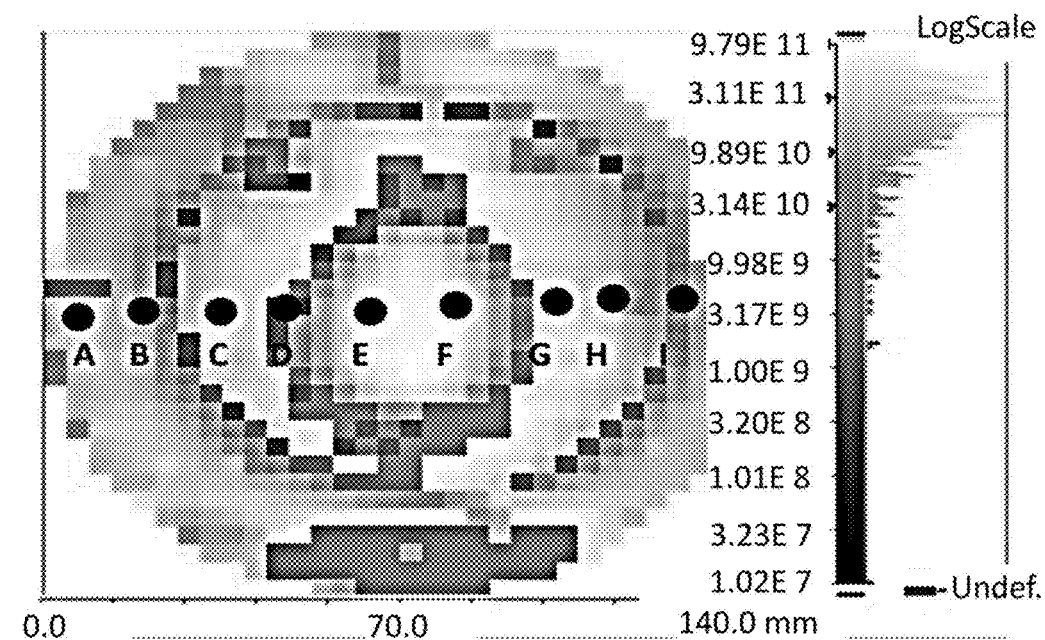
FIG. 11 is a schematic diagram of the PL/TO ratio according to the first embodiment of the present application.
Figure 11:
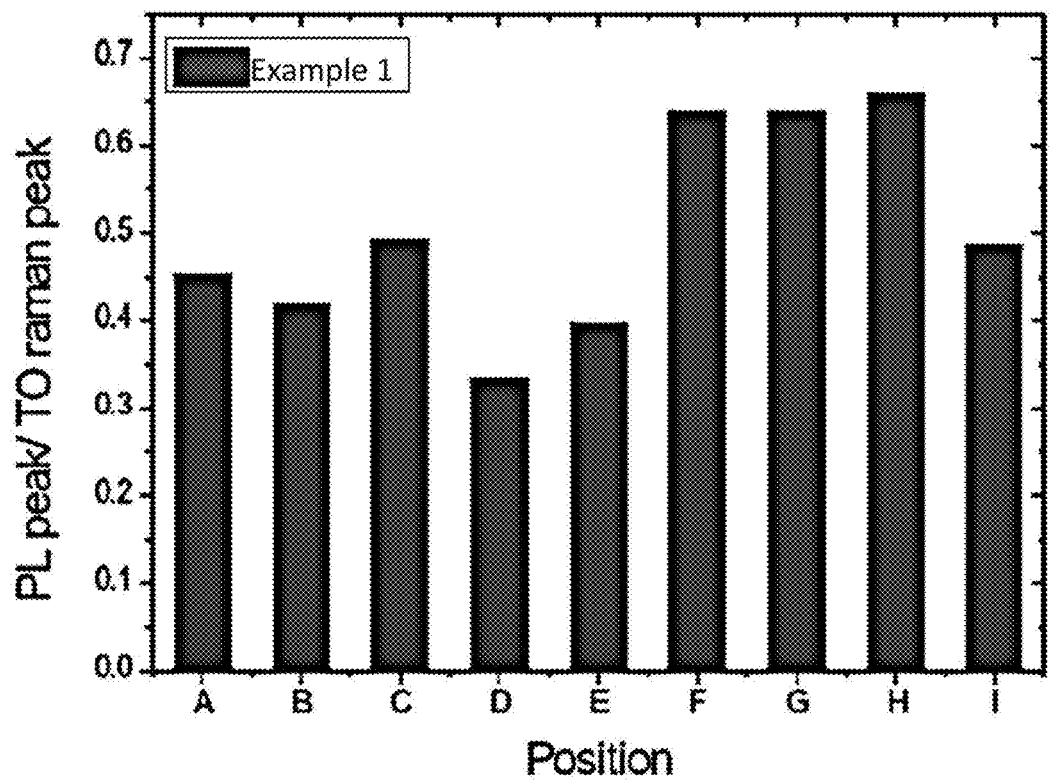

FIG. 11 is a schematic diagram of the PL/TO ratio of the first embodiment. Taking the first embodiment as an example, nine measurement points are selected. The PL/TO ratio is shown in the figure, and the PL/TO ratio, silicon-vacancy concentration, and resistivity values of the nine measurement points (A, B, C, D, E, F, G, H, and I) are as follows:

| measurement point | PL/TO ratio | silicon-vacancy concentration (cm^-3) | resistivity values (ohm-cm) |
|---|---|---|---|
| A | 0.45 | 7.34E+11 | 1E11 |
| B | 0.43 | 7.01E+11 | 1E9 |
| C | 0.5 | 8.15E+11 | 1E11 |
| D | 0.32 | 5.22E+11 | 1E10 |
| E | 0.4 | 6.52E+11 | 1E11 |
| F | 0.64 | 1.04E+12 | 1E11 |
| G | 0.64 | 1.04E+12 | 1E11 |
| H | 0.65 | 1.06E+12 | 1E11 |
| I | 0.49 | 7.99E+11 | 1E10 |

Figure 12:
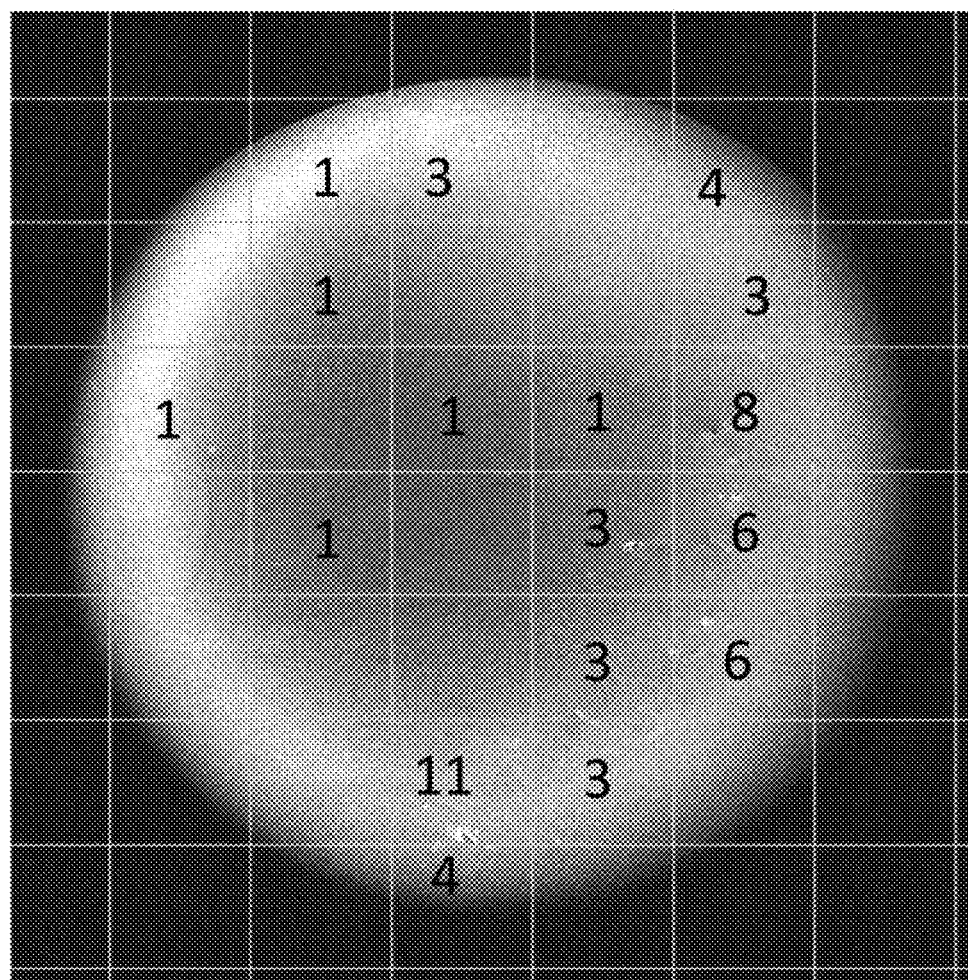
FIG. 12 is a schematic diagram of the micro-pipe density of the high-purity semi-insulating single-crystal silicon carbide wafer according to the third embodiment of the present application.
Figure 13:
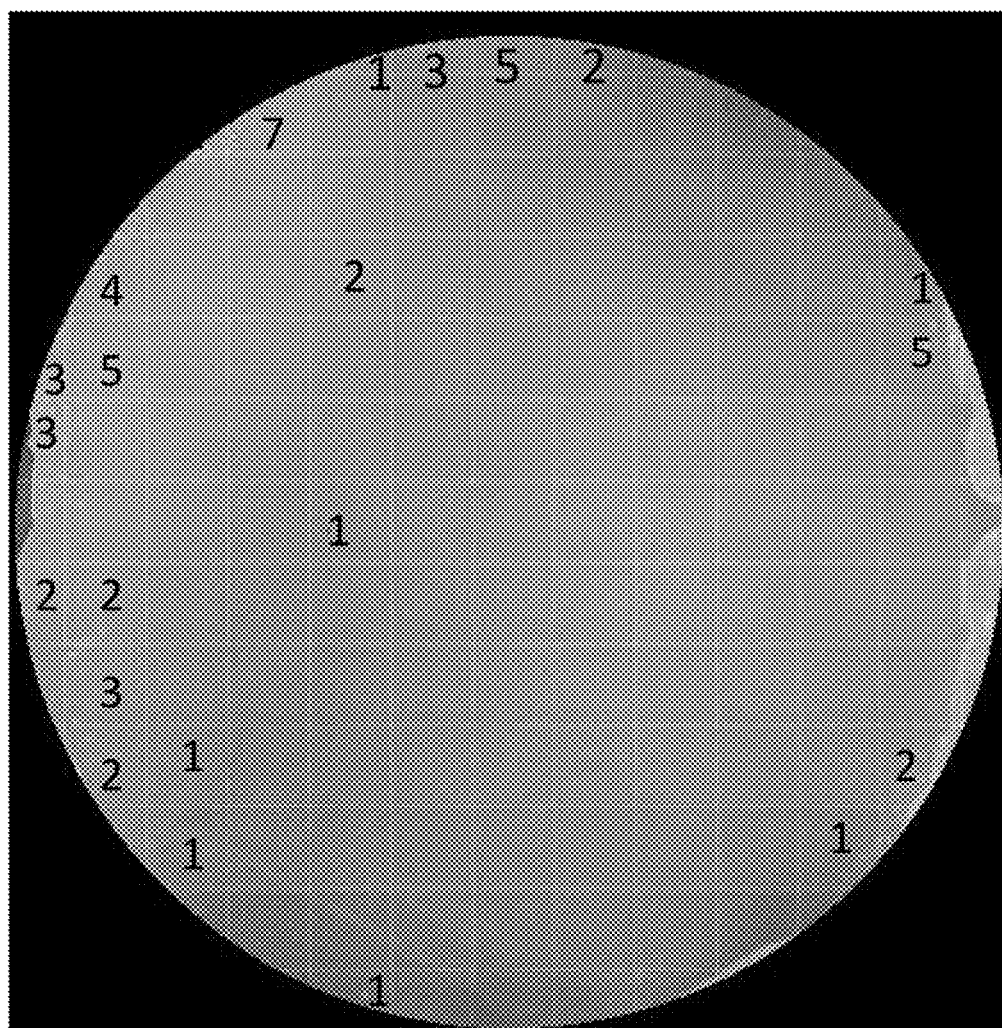
FIG. 13 is a schematic diagram of the micro-pipe density of the high-purity semi-insulating single-crystal silicon carbide wafer according to the fourth embodiment of the present application.

FIG. 12 is a schematic diagram of the third embodiment of the application, and the diameter thereof is 60 mm. FIG. 13 is a schematic diagram of the fourth embodiment of the application, and the diameter thereof is 120 mm. FIGS. 12 and 13 show the micro-pipe density (MPD). In the figure, the silicon carbide wafer is divided into multiple squares, and the numbers in the squares refer to the number of micro-pipes. The number of micro-pipes in the third embodiment is 60. Dividing by the area of the wafer, the micro-pipe density may be obtained as 2.1/cm^2. The number of micro-pipes in the fourth embodiment is 56. Dividing by the area of the wafer, the micro-pipe density may be obtained as 0.5/cm^2.

In the high-purity crystal growth system of the present application, by controlling the Si/C ratio and particle size distribution of the high-purity crystal growth raw material, and the crystal growth temperature and time during the crystal growth process, the system becomes a carbon-rich (C-rich) environment. In a state where shallow-level conductive elements are scarce, the intrinsic defect of silicon vacancy may be generated in the crystal and the silicon-vacancy concentration may be controlled. The intrinsic defect is used to increase the resistivity of the crystal in order to make the wafer be semi-insulated.

A person of ordinary skill in the art will understand current and future manufacturing processes, method and step from the content disclosed in some embodiments of the present disclosure, as long as the current or future manufacturing processes, method, and step performs substantially the same functions or obtain substantially the same results as the present disclosure. Therefore, the scope of the present disclosure includes the above-mentioned manufacturing process, method, and steps.

The above descriptions are only examples of this application and are not intended to limit this application. This disclosure may have various modifications and changes for a person of ordinary skill in the art. Any modification, equivalent replacement, improvement, etc. made within the spirit and principle of this application shall be included in the scope of the claims of this disclosure.

What is claimed is:

1. A high-purity semi-insulating single-crystal silicon carbide wafer, comprising one polytype single-crystal, wherein the high-purity semi-insulating single-crystal silicon carbide wafer has silicon vacancy inside, and a silicon-vacancy concentration is greater than 5E11 cm^-3.

2. The high-purity semi-insulating single-crystal silicon carbide wafer according to claim 1, wherein the silicon-vacancy concentration is less than 5E13 cm^-3.

3. The high-purity semi-insulating single-crystal silicon carbide wafer according to claim 1, wherein a resistivity of the high-purity semi-insulating single-crystal silicon carbide wafer is greater than 1E7 ohm-cm.

4. The high-purity semi-insulating single-crystal silicon carbide wafer according to claim 1, wherein a micro-pipe density of the high-purity semi-insulating single-crystal silicon carbide wafer is less than 3 per square centimeter.

5. The high-purity semi-insulating single-crystal silicon carbide wafer according to claim 4, wherein a micro-pipe density of the high-purity semi-insulating single-crystal silicon carbide wafer is less than 2 per square centimeter.

6. The high-purity semi-insulating single-crystal silicon carbide wafer according to claim 5, wherein a micro-pipe density of the high-purity semi-insulating single-crystal silicon carbide wafer is less than 1 per square centimeter.

7. The high-purity semi-insulating single-crystal silicon carbide wafer according to claim 6, wherein a micro-pipe density of the high-purity semi-insulating single-crystal silicon carbide wafer is less than 0.4 per square centimeter.

8. The high-purity semi-insulating single-crystal silicon carbide wafer according to claim 7, wherein a micro-pipe density of the high-purity semi-insulating single-crystal silicon carbide wafer is less than 0.1 per square centimeter.

9. The high-purity semi-insulating single-crystal silicon carbide wafer according to claim 1, wherein the one polytype single-crystal is selected from 3C, 4H, 6H, and 15R polymorphs of silicon carbide.

10. The high-purity semi-insulating single-crystal silicon carbide wafer according to claim 1, wherein a diameter of the high-purity semi-insulating single-crystal silicon carbide wafer is greater than or equal to 90 mm.

11. The high-purity semi-insulating single-crystal silicon carbide wafer according to claim 1, wherein a diameter of the high-purity semi-insulating single-crystal silicon carbide wafer is less than or equal to 200 mm.

12. The high-purity semi-insulating single-crystal silicon carbide wafer according to claim 1, wherein the high-purity semi-insulating single-crystal silicon carbide wafer has a positive axis orientation.

13. The high-purity semi-insulating single-crystal silicon carbide wafer according to claim 1, wherein the high-purity semi-insulating single-crystal silicon carbide wafer has an off-axis orientation.

14. The high-purity semi-insulating single-crystal silicon carbide wafer according to claim 13, wherein the off-axis orientation is selected from 4°, 3.5°, and 2°.

15. A high-purity semi-insulating single-crystal silicon carbide crystal, which is grown by depositing a vapor containing silicon and carbon on the growth surface of a seed, comprising one polytype single-crystal, wherein the high-purity semi-insulating single-crystal silicon carbide crystal has silicon vacancy inside, and a silicon-vacancy concentration is greater than 5E11 cm^-3.

16. The high-purity semi-insulating single-crystal silicon carbide crystal according to claim 15, wherein the silicon-vacancy concentration is less than 5E13 cm^-3.

* * * * *